(12) United States Patent
Oba et al.

(10) Patent No.: US 9,773,646 B2
(45) Date of Patent: Sep. 26, 2017

(54) PLASMA ION SOURCE AND CHARGED PARTICLE BEAM APPARATUS

(71) Applicant: HITACHI HIGH-TECHNOLOGIES CORPORATION, Minato-ku, Tokyo (JP)

(72) Inventors: Hiroshi Oba, Tokyo (JP); Yasuhiko Sugiyama, Tokyo (JP); Mamoru Okabe, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 0 days.

(21) Appl. No.: 15/019,990

(22) Filed: Feb. 10, 2016

(65) Prior Publication Data
US 2016/0240354 A1 Aug. 18, 2016

(30) Foreign Application Priority Data
Feb. 13, 2015 (JP) .................................. 2015-026843

(51) Int. Cl.
| | |
|---|---|
| *H01J 37/08* | (2006.01) |
| *H01J 37/32* | (2006.01) |
| *H01J 37/20* | (2006.01) |
| *H01J 27/16* | (2006.01) |
| *H01J 37/06* | (2006.01) |

(52) U.S. Cl.
CPC ........ *H01J 37/32522* (2013.01); *H01J 27/16* (2013.01); *H01J 37/06* (2013.01); *H01J 37/08* (2013.01); *H01J 37/20* (2013.01); *H01J 37/321* (2013.01); *H01J 37/3211* (2013.01); *H01J 37/32357* (2013.01); *H01J 37/32422* (2013.01); *H01J 37/32568* (2013.01); *H01J 37/32807* (2013.01)

(58) Field of Classification Search
CPC ...... H01J 37/32522; H01J 27/16; H01J 37/06; H01J 37/08; H01J 37/20; H01J 37/321; H01J 37/3211; H01J 37/32357; H01J 37/32422; H01J 37/32568; H01J 37/32807
USPC ............. 250/423 R, 424, 423 F; 315/111.01, 315/111.21, 111.81
See application file for complete search history.

(56) References Cited

U.S. PATENT DOCUMENTS

| | | | |
|---|---|---|---|
| 6,432,260 B1 * | 8/2002 | Mahoney ............... | H01J 37/321 118/723 AN |
| 2004/0084153 A1 * | 5/2004 | Fink ...................... | H01J 37/321 156/345.48 |

(Continued)

FOREIGN PATENT DOCUMENTS

JP 2011-142081 7/2011

*Primary Examiner* — Nicole Ippolito
(74) *Attorney, Agent, or Firm* — Brinks Gilson & Lione

(57) ABSTRACT

A plasma ion source includes: a gas introduction chamber, into which raw gas is introduced; a plasma generation chamber connected to the gas introduction chamber and made of a dielectric material; a coil wound along an outer circumference of the plasma generation chamber and to which high-frequency power is applied; an envelope surrounding the gas introduction chamber, the plasma generation chamber and the coil; and insulating liquid filled inside the gas introduction chamber, the plasma generation chamber and the envelope to immerse the coil and having an dielectric strength voltage relatively greater than that of the envelope and the same dielectric dissipation factor as the plasma generation chamber.

7 Claims, 3 Drawing Sheets

(56) References Cited

U.S. PATENT DOCUMENTS

2012/0261587 A1* 10/2012 Kellogg .................. H01J 27/16
                                                    250/396 R
2013/0134307 A1*  5/2013 Routh, Jr. ............... H01J 27/16
                                                    250/305

* cited by examiner

PLASMA ION SOURCE AND CHARGED PARTICLE BEAM APPARATUS

CROSS-REFERENCE TO RELATED APPLICATION

This application claims priority from Japanese Patent Application No. 2015-026843, filed on Feb. 13, 2015, the entire subject matter of which is incorporated herein by reference.

BACKGROUND

1. Field of the Invention

The present disclosure relates to a plasma ion source and a charged particle beam apparatus.

2. Description of the Related Art

Conventionally, a configuration for a plasma ion source is known, in which a flow restrictor is provided for restricting flow of gas introduced into a plasma chamber to generate voltage drop between a gas supplier and plasma in gas maintained at high pressure so as to suppress arc discharge (for example, JP-A-2011-142081).

In the plasma ion source of the related art, a cooling fluid channel is provided around a plasma generation chamber in order to cool a wall portion of a plasma generation chamber, the temperature of which easily increases due to contact with high-density plasma, and a coil which is easily heated by applying high-frequency power. Therefore, the entire size of the plasma ion source increases to several times that of the plasma generation chamber.

SUMMARY

The present disclosure has been made in view of such a problem and one of objects of the present disclosure is to provide a plasma ion source and a charged particle beam apparatus, which are capable of preventing the entire size of the plasma ion source from increasing in order to ensure desired cooling performance.

According to an exemplary embodiment of the present disclosure, there is provided a plasma ion source including: a gas introduction chamber, into which raw gas is introduced; a plasma generation chamber connected to the gas introduction chamber and made of a dielectric material; a coil wound along an outer circumference of the plasma generation chamber and to which high-frequency power is applied; an envelope surrounding the gas introduction chamber, the plasma generation chamber and the coil; and insulating liquid filled inside the gas introduction chamber, the plasma generation chamber and the envelope to immerse the coil and having an dielectric strength voltage relatively greater than that of the envelope and the same dielectric dissipation factor as the plasma generation chamber.

According to another exemplary embodiment of the present disclosure, there is provided a charged particle beam apparatus including: the plasma ion source; an ion beam barrel that irradiates ion beam by ions of the raw gas generated in the plasma ion source; a stage on which a sample is mounted; and a controller that controls the ion beam barrel and the stage to irradiate the ion beam onto the sample and performs at least any one of observation, processing and analysis of an irradiated area of the sample.

BRIEF DESCRIPTION OF THE DRAWINGS

The above and other aspects of the present disclosure will become more apparent and more readily appreciated from the following description of illustrative embodiments of the present disclosure taken in conjunction with the attached drawings, in which.

DETAILED DESCRIPTION

Hereinafter, a plasma ion source and a charged particle beam apparatus according to an embodiment of the present disclosure will be described with reference to the accompanying drawings.

Figure 1:
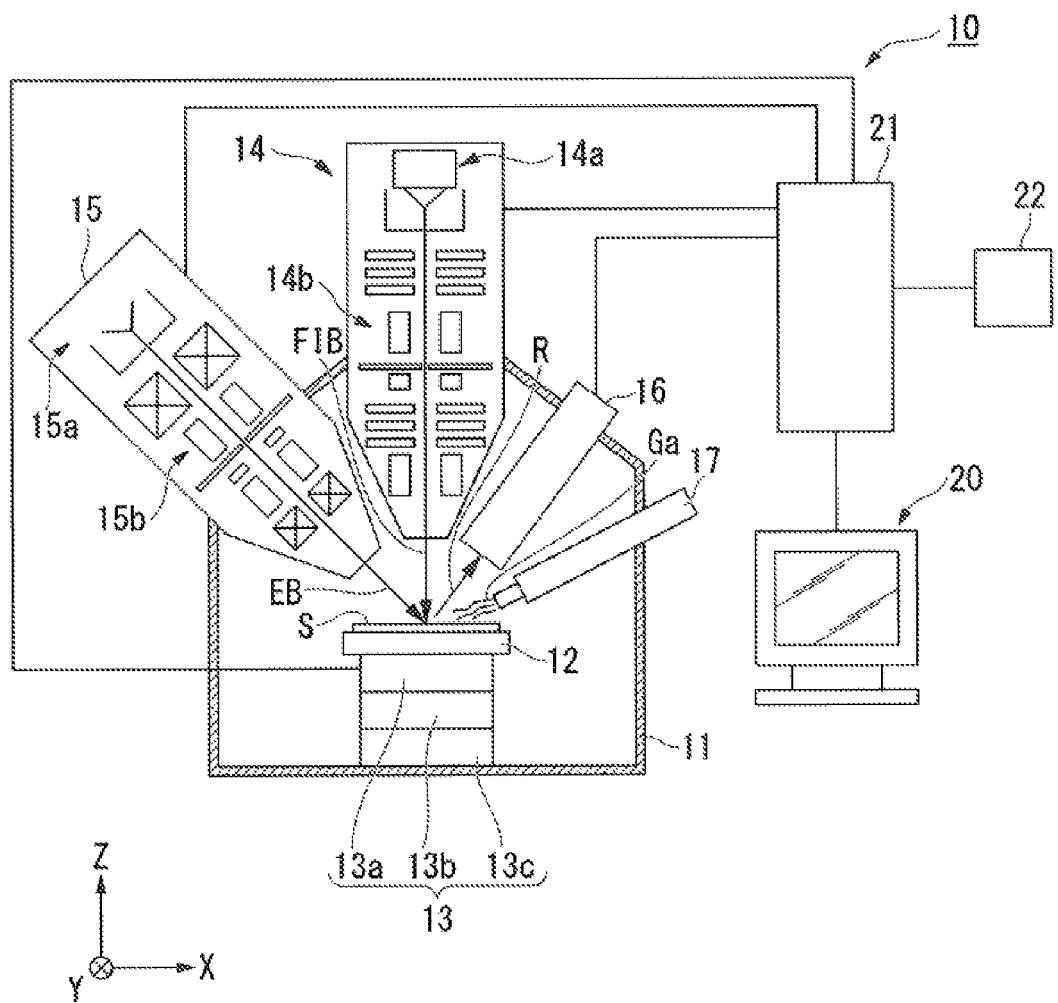
FIG. 1 is a schematic cross-sectional view showing the configuration of a charged particle beam apparatus according to an embodiment of the present disclosure.

A charged particle beam apparatus 10 according to the present embodiment includes a sample chamber 11, the inside of which is able to maintain in a vacuum state, a stage 12 for fixing a sample S in the sample chamber 11, and an actuator 13 that actuates the stage 12, as shown in FIG. 1. The charged particle beam apparatus 10 includes a focused ion beam lens barrel 14 for irradiating focused ion beams FIB to an irradiated subject in a predetermined irradiation area (that is, a scan range) in the sample chamber 11. The charged particle beam apparatus 10 includes an electron beam barrel 15 for irradiating electron beams EB to the irradiated subject in the predetermined irradiation area in the sample chamber 11. The charged particle beam apparatus 10 includes a detector 16 for detecting secondary charged particles (secondary electrons or secondary ions) R generated from the irradiated subject by irradiation of the focused ion beams or electron beams. The charged particle beam apparatus 10 includes a detector (not shown) for detecting secondary charged particles (reflection electrons) generated from the irradiated subject by irradiation of electron beams in the electron beam barrel 15. The charged particle beam apparatus 10 includes a gas supply unit 17 for supplying gas Ga to a surface of the irradiated subject. The charged particle beam apparatus 10 includes a display device 20 for displaying image data based on secondary charged particles detected by the detector 16, a controller 21 and an input device 22.

The charged particle beam apparatus 10 may perform various processes (etching process, etc.) through sputtering and form a deposition film by scanning and irradiating the focused ion beams onto the surface of the irradiated subject. The charged particle beam apparatus 10 may perform a process of forming, in the sample S, a cross section for cross-section observation through a scanning-type electron microscope and a process of forming a sample piece (for example, a thin sample, a needle-shaped sample, etc.) for transmission observation through a transmission-type electron microscope. The charged particle beam apparatus 10 may scan and irradiate the focused ion beams or electron beams onto the surface of the irradiated subject such as the sample S, thereby observing the surface of the irradiated surface.

The sample chamber 11 is evacuated until the inside thereof becomes a desired vacuum state by an exhaust device (not shown) and is configured to maintain a desired vacuum state. The stage 12 holds the sample S.

The actuator 13 is housed in the sample chamber 11 in a state of being connected to the stage 12 and displaces the stage 12 with respect to a predetermined axis according to a control signal output from the controller 21. The actuator 13 includes a movement mechanism 13a for moving the stage 12 in parallel along X and Y axes parallel to a horizontal plane and orthogonal to each other and a Z axis of a vertical direction orthogonal to the X and Y axes. The actuator 13 includes a tilt mechanism 13b for tilting the stage 12 around the X axis or Y axis and a rotation mechanism 13c for rotating the stage 12 around the Z axis.

The focused ion beam lens barrel 14 is fixed to the sample chamber 11 such that a beam emission unit (not shown) faces the stage 12 at a upper side of the stage 12 in a vertical direction within the irradiation area in the sample chamber 11 and an optical axis thereof is parallel to the vertical direction. Thus, focused ion beams can be irradiated to the irradiated subject such as the sample S fixed on the stage 12 downward in the vertical direction.

The focused ion beam barrel 14 includes a plasma ion source 14a for generating ions and an ion optical system 14b for focusing and deflecting the ions emitted from the plasma ion source 14a. The plasma ion source 14a and the ion optical system 14b are controlled according to a control signal output from the controller 21 and the irradiation position and irradiation condition of the focused ion beam is controlled by the controller 21. The ion optical system 14b includes a first electrostatic lens, such as a condenser lens an electrostatic deflector, a second electrostatic lens such as an objective lens and the like, for example. Although two sets of electrostatic lenses are shown in FIG. 1, three sets or more of electrostatic lenses may be provided. In this case, an aperture is mounted between the lenses in the ion optical system 14b.

Figure 2:
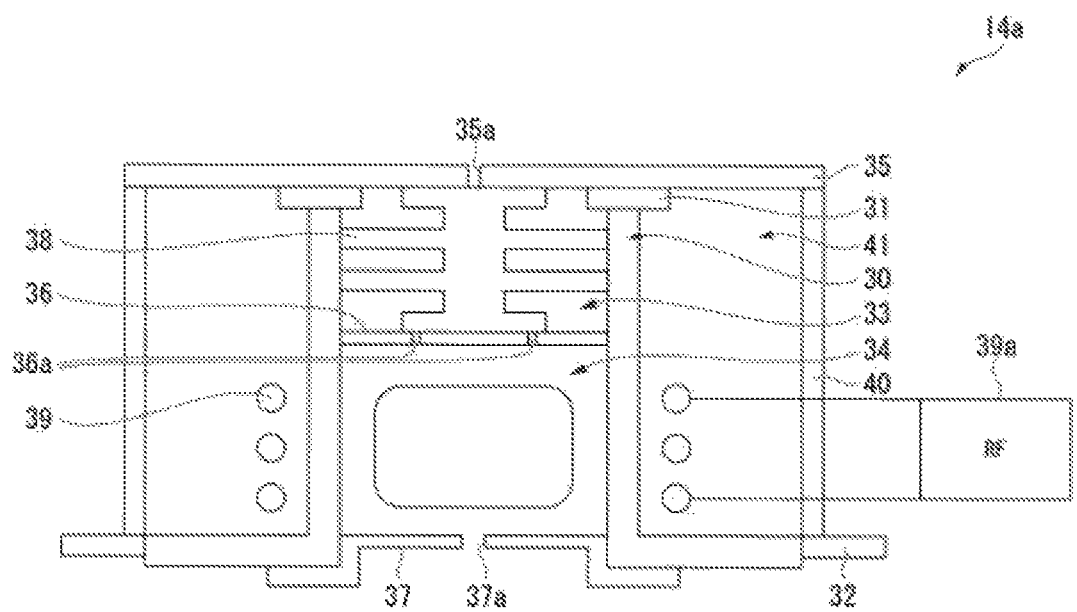
FIG. 2 is a schematic cross-sectional view showing the configuration of a plasma ion source according to an embodiment of the present disclosure.

The plasma ion source 14a is a high-frequency inductively-coupled plasma ion source. The plasma ion source 14a includes a torch 30, first ground potential flange 31 and second ground potential flange 32, a gas introduction chamber 33, a plasma generation chamber 34, a gas introduction chamber material 35, a terminal electrode 36, a plasma electrode 37, an insulation member 38, a coil 39, an envelope 40 and insulating liquid 41, as shown in FIG. 2.

The torch 30 has a tube shape. The torch 30 is made of a dielectric material. The dielectric material may be any one of quartz glass, alumina and aluminum nitride, for example. In a first end of the torch 30, the first ground potential flange 31 is provided. In a second end of the torch 30, the second ground potential flange 32 is provided. The first ground potential flange 31 and the second ground potential flange 32 are maintained at a ground potential. The first ground potential flange 31 and the second ground potential flange 32 are made of non-magnetic metal such as copper or aluminum, for example.

The torch 30 provides chambers that serve as the gas introduction chamber 33 and the plasma generation chamber 34. The gas introduction chamber 33 is formed by the gas introduction chamber material 35 connected to the first ground potential flange 31 and the terminal electrode 36 provided in the torch 30. The plasma generation chamber 34 is formed by the terminal electrode 36 and the plasma electrode 37 provided at the second end of the torch 30. The terminal electrode 36 and the plasma electrode 37 are made of non-magnetic metal such as copper, tungsten, and molybdenum. Since plasma is attached to the inner wall of the torch 30 by sputtering the terminal electrode 36 and the plasma electrode 37, tungsten or molybdenum having high energy necessary for sputtering is preferable. The insulation member 38 is housed in the gas introduction chamber 33. The coil 39 wound along the outer circumference of the plasma generation chamber 34 is provided outside the torch 30. High-frequency power is supplied from an RF power source 39a to the coil 39.

The envelope 40 is connected to the first ground potential flange 31 and the second ground potential flange 32 so as to surround the gas introduction chamber 33, the plasma generation chamber 34 and the coil 39. The insulation liquid 41 in which the coil 39 is immersed between the gas introduction chamber 33 and the plasma generation chamber 34 and the envelop 40.

In the gas introduction chamber material 35, an opening 35a for introducing raw gas supplied from a gas supply source (not shown) via a flow controller (not shown) into the gas introduction chamber 33 is formed.

In the terminal electrode 36 provided at the boundary between the gas introduction chamber 33 and the plasma generation chamber 34, a plurality of through-holes 36a for introducing raw gas from the gas introduction chamber 33 to the plasma generation chamber 34 is formed. The size of each of the plurality of through-holes 36a (for example, the diameter of the circular through-hole 36a) is smaller than the length of a plasma sheath. The length of the plasma sheath is several tens of micrometer to several hundreds of micrometer, for example.

In the plasma electrode 37, an opening 37a for extracting ions out from the plasma generation chamber 34 is formed.

Figure 3:
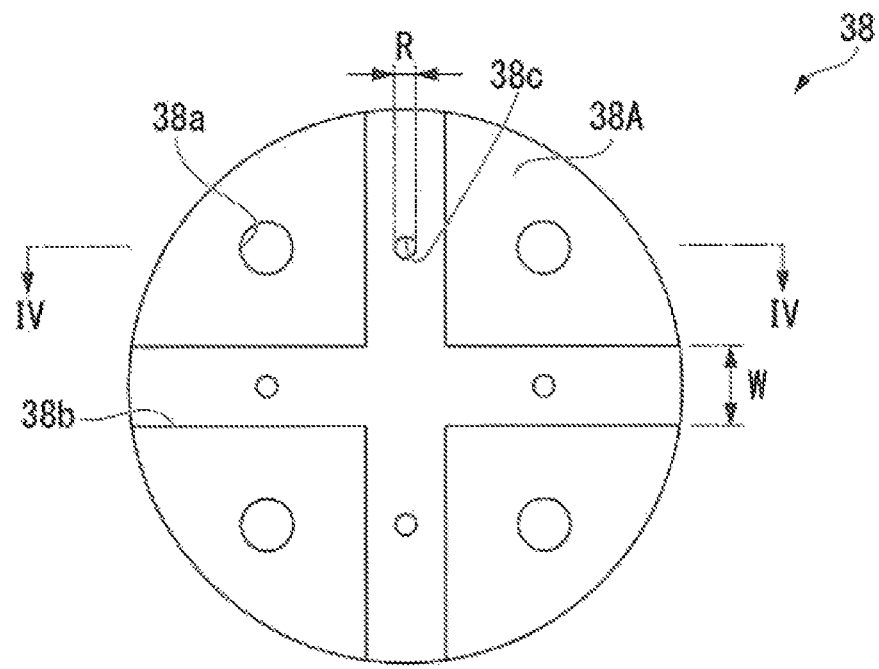
FIG. 3 is a plan view showing an insulation member of a plasma ion source according to an embodiment of the present disclosure when viewed from a plasma generation chamber side.
Figure 4:
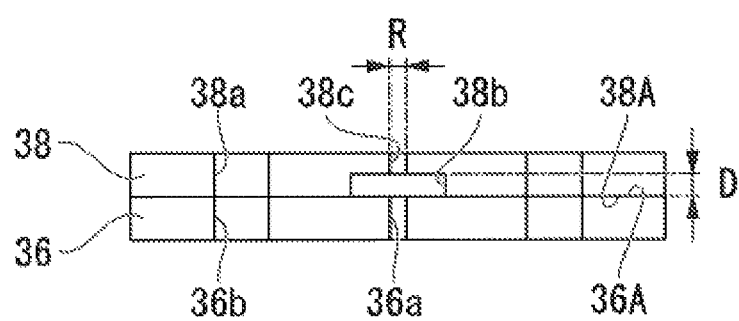
FIG. 4 is a cross-sectional view of an insulation member and a terminal electrode taken along a IV-IV line shown in FIG. 3.

The insulation member 38 of the gas introduction chamber 33 is fixed to the terminal electrode 36 by a connection member (not shown) such as a bolt. As shown in FIG. 3, a mounting hole 38a, in which a connection member is mounted, is formed in the insulation member 38. In an opposite surface 38A of the insulation member 38 facing a surface 36A of the insulation electrode 36, as shown in FIG. 4, a concave groove 38b is formed. The depth D of the concave groove 38b is smaller than the length of the plasma sheath. The width W of the concave groove 38b is greater than the depth D. In the insulation member 38, a plurality of through-holes 38c formed in the concave groove 38b is formed. The size of each of the plurality of through-holes 38c (for example, the diameter of the circular through-hole 38c) is smaller than the length of the plasma sheath. The size of each of the plurality of through-holes 38c is equal to the size R of each of the plurality of through-holes 36a in the plasma electrode 37, for example. Each of the plurality of through-holes 38c is located to face each of the plurality of through-holes 36a in the plasma electrode 37, for example.

In addition, in the plasma electrode 37, a mounting hole 36b, in which the connection member (not shown) is mounted, is formed to face the mounting hole 38a of the insulation member 38.

The insulation member 38 is shaped to prevent direct movement of charged particles between the gas introduction chamber material 35 and the terminal electrode 36. The insulation member 38 is shaped such that the gas introduction chamber material 35 and the terminal electrode 36 are not directly visible to the other. The insulation member 38 has a male thread shape, for example.

The envelope 40 is made of a material having a high heat dissipation property (thermal conductivity) such as copper or aluminum, for example.

The insulating liquid 41 has a dielectric strength voltage relatively greater than that of the envelope 40 and the same dielectric dissipation factor as the plasma generation chamber 34. The insulating liquid 41 is fluorine based inert liquid.

The electron beam barrel 15 is fixed to the sample chamber 11 such that a beam emission unit (not shown) faces the stage 12 in an inclination direction inclined at a predetermined angle from the vertical direction of the stage 12 within the irradiation area in the sample chamber 11 and an optical axis thereof is parallel to the inclination direction. Thus, the electron beams may be irradiated to the irradiated subject such as the sample S fixed on the stage 12 downward in the inclination direction.

The electron beam barrel 15 includes an electron source 15a for generating electrons and an electronic optical system 15b for focusing and deflecting the electrons emitted from the electron source 15a. The electron source 15a and the electronic optical system 15b are controlled according to a control signal output from the controller 21 and the irradiation position and irradiation condition of the electron beams are controlled by the controller 21. The electronic optical system 15b includes, for example, an electromagnetic lens and a deflector.

The electron beam barrel 15 and the focused ion beam barrel 14 may be exchangeably arranged, such that the electron beam barrel 15 is arranged in the vertical direction and the focused ion beam barrel 14 is arranged in the inclination direction inclined at the predetermined angle from the vertical direction.

The detector 16 detects the intensity of secondary charged particles (secondary electrons, secondary ions, and the like) R (that is, the amount of secondary charged particles) radiated from the irradiated subject when the focused ion beams or the electron beams are irradiated to the irradiated subject such as the sample S and outputs information on the amount of detected secondary charged particles R. The detector 16 is located at a position where the amount of secondary charged particles R is capable of being detected in the sample chamber 11, for example, at an oblique upper side of the irradiated subject such as the sample S within the irradiated area, and is fixed to the sample chamber 11.

The gas supply unit 17 is fixed to the sample chamber 11 such that a gas spraying unit (not shown) faces the stage 12 in the sample chamber 11. The gas supply unit 17 may supply, to the sample S, etching gas for selectively facilitating etching of the sample S by the focused ion beams according to the material of the sample S, deposition gas for forming a deposition film by a deposited material such as metal or insulator on the surface of the sample S, and the like. For example, etching gas such as xenon fluoride for an Si based sample S, water for the sample S of an organic system, or the like is supplied to the sample S while irradiating the focused ion beams, thereby selectively facilitating etching. For example, deposition gas of compound gas containing phenanthrene, platinum, carbon, tungsten or the like is supplied to the sample S while irradiating the focused ion beams, thereby depositing a solid component decomposed from the deposition gas on the surface of the sample S.

The controller 21 is arranged outside the sample chamber 11 and is connected to the display device 20 and the input device 22 for outputting a signal according to input operation of an operator, such as a mouse and a keyboard.

The controller 21 integrally controls operation of the charged particle beam apparatus 10 by a signal output from the input device 22 or a signal generated by a predetermined automatic operation control process.

The controller 21 converts the amount of secondary charged particles detected by the detector 16 while scanning the irradiation position of the charged particle beam into a luminance signal corresponding to the irradiation position and generates image data indicating the shape of the irradiated subject by two-dimensional position distribution of the amount of detected secondary charged particles. The controller 21 displays a screen for executing operation such as enlargement, reduction and rotation of each image data on the display device 20 along with each generated image data. The controller 21 displays a screen for performing a variety of settings such as processing settings on the display device 20.

As described above, according to the plasma ion source 14a of the embodiment of the present disclosure, since the plasma generation chamber 34 and the coil 39 can be cooled by the insulating liquid 41 filled in the envelope 40, it is possible to prevent the entire size of the plasma ion source 14a from increasing as compared to the case of providing the insulating liquid channel such as a heat pipe around the plasma generation chamber 34 and the coil 39, for example.

Since the coil 39 is arranged as close as possible to the plasma generation chamber 34 in the envelope 40, it is possible to efficiently apply high-frequency power to plasma.

Since the envelope 40 is made of a material having high thermal conductivity, heat delivered from the plasma generation chamber 34 and the coil 39 to the envelope 40 by convection of the insulating liquid 41 is efficiently dissipated from the envelope 40.

Since the envelope 40 is made of non-magnetic metal having high electric conductivity, it is possible to prevent useless power loss from increasing even when induction current is generated around the coil 39.

As described above, according to the charged particle beam apparatus 10 of the embodiment of the present disclosure, it is possible to prevent the entire size of the apparatus from increasing.

In the above-described embodiment, a heat dissipation fin may be provided in the envelope 40.

In the above-described embodiment, a device (a cooling device, a pump and the like) for pumping the insulating liquid 41 out of the envelope 40 and supplying the insulating liquid into the envelope 40 after cooling may be provided.

In the above-described embodiment, the electron beam barrel 15 may be omitted.

In the above-described embodiment, the controller 21 may be a software functional unit or a hardware functional unit such as LSI.

What is claimed is:
1. A plasma ion source comprising:
a gas introduction chamber, into which raw gas is introduced;
a plasma generation chamber connected to the gas introduction chamber and made of a dielectric material;
a coil wound along an outer circumference of the plasma generation chamber and to which high-frequency power is applied;
an envelope surrounding the gas introduction chamber, the plasma generation chamber and the coil;
a liquid chamber configured between an outer wall of the gas introduction chamber and an inner wall of the envelope and between an outer wall of the plasma generation chamber and the inner wall of the envelope; and
insulating liquid filled inside the liquid chamber to immerse the coil and having a dielectric strength volt- age relatively greater than that of the envelope and the same dielectric dissipation factor as the plasma generation chamber.

2. The plasma ion source according to claim 1, wherein the envelope is made of copper or aluminum.

3. The plasma ion source according to claim 1, wherein the insulating liquid is fluorine based inert liquid.

4. The plasma ion source according to claim 1, wherein the plasma generation chamber is made of any one of quartz glass, alumina and aluminum nitride.

5. The plasma ion source according to claim 1 further comprising:
a heat dissipation fin provided in the envelope.

6. A charged particle beam apparatus comprising:
the plasma ion source according to claim 1;
an ion beam barrel that irradiates ion beam by ions of the raw gas generated in the plasma ion source;
a stage on which a sample is mounted; and
a controller that controls the ion beam barrel and the stage to irradiate the ion beam onto the sample and performs at least any one of observation, processing and analysis of an irradiated area of the sample.

7. The charged particle beam apparatus according to claim 6 further comprising:
an electron beam barrel that irradiates electron beam,
wherein the controller further controls the ion beam barrel and the electron beam barrel to irradiate the ion beam and the electron beam onto the same area of the sample and performs at least any one of observation, processing and analysis of the irradiated area of the sample.

* * * * *